(12) United States Patent  
Zeng

(10) Patent No.: US 12,513,796 B1  
(45) Date of Patent: Dec. 30, 2025

(54) PLUG-IN LED LAMP BEAD WITH BUILT-IN SINGLE IC HAVING BIDIRECTIONAL FLASHING FUNCTION

(71) Applicant: Linhai Qinghui Light Electricity Lamp Co., Ltd., Taizhou (CN)

(72) Inventor: Yongfu Zeng, Loudi (CN)

(73) Assignee: Linhai Qinghui Light Electricity Lamp Co., Ltd., Taizhou (CN)

( * ) Notice: Subject to any disclaimer, the term of this patent is extended or adjusted under 35 U.S.C. 154(b) by 41 days.

(21) Appl. No.: 18/805,933

(22) Filed: Aug. 15, 2024

(51) Int. Cl.
| | |
|---|---|
| H05B 45/10 | (2020.01) |
| H01L 25/075 | (2006.01) |
| H05B 45/325 | (2020.01) |
| H10H 20/854 | (2025.01) |
| H10H 20/857 | (2025.01) |

(52) U.S. Cl.
CPC ......... *H05B 45/10* (2020.01); *H01L 25/0753* (2013.01); *H05B 45/325* (2020.01); *H10H 20/854* (2025.01); *H10H 20/857* (2025.01)

(58) Field of Classification Search
CPC .... H05B 45/10; H05B 45/325; H10H 20/854; H10H 20/857; H01L 25/0753
See application file for complete search history.

(56) References Cited

U.S. PATENT DOCUMENTS

2024/0255110 A1\* 8/2024 Miskin .................. H05B 45/42

FOREIGN PATENT DOCUMENTS

| CN | 110462928 B | * | 12/2021 | ............... H02H 9/02 |
|---|---|---|---|---|
| CN | 215581780 U | * | 1/2022 | |
| CN | 220776123 U | * | 4/2024 | |
| TW | M669005 U | * | 4/2025 | |

\* cited by examiner

*Primary Examiner* — Adam D Houston  
(74) *Attorney, Agent, or Firm* — Westbridge IP LLC

(57) ABSTRACT

Disclosed is a plug-in light-emitting diode (LED) lamp bead with a built-in single integrated circuit (IC) chip having a bidirectional flashing function. An IC chip having a bidirectional flashing function is bonded to any one of brackets by using an electrically conductive and thermally conductive adhesive, and two light-emitting chips are bonded to the two brackets respectively by using an electrically conductive and thermally conductive adhesive; a first power driving electrode of the IC chip is electrically connected to a first bracket and a positive electrode of a first light-emitting chip, and a first output terminal of the IC chip is electrically connected to a negative electrode of the first light-emitting chip; a second power driving electrode of the IC chip is electrically connected to a second bracket and a positive electrode of a second light-emitting chip.

4 Claims, 2 Drawing Sheets

PLUG-IN LED LAMP BEAD WITH BUILT-IN SINGLE IC HAVING BIDIRECTIONAL FLASHING FUNCTION

TECHNICAL FIELD

This disclosure relates to the field of light-emitting diode (LED) lamp beads and, in particular, to a plug-in LED lamp bead with a built-in single integrated circuit (IC) having a bidirectional flashing function.

BACKGROUND

At present, in prior art, two built-in ICs are provided to control LED lamp beads to emit light or flash. Such a structure causes an increase in manufacturing costs, and use of multiple components increases the number of connection processes, which is very disadvantageous to manufacturing efficiency.

SUMMARY

An objective of this disclosure is to address the deficiencies of prior art and at least solve the technical problems in related technologies to a certain extent, and provide a plug-in LED lamp bead with a built-in single IC having a bidirectional flashing function, with the advantage of improving production efficiency.

In order to solve the technical problems mentioned above, the technical solution of this disclosure is as follows: a plug-in LED lamp bead with a built-in single IC chip having a bidirectional flashing function, comprising two brackets, wherein an IC chip having a bidirectional flashing function is bonded to any one of the brackets by using an electrically conductive and thermally conductive adhesive, and two light-emitting chips are bonded to the two brackets respectively by using an electrically conductive and thermally conductive adhesive;

a first power driving electrode of the IC chip is electrically connected to a first bracket and a positive electrode of a first light-emitting chip, and a first output terminal of the IC chip is electrically connected to a negative electrode of the first light-emitting chip;

a second power driving electrode of the IC chip is electrically connected to a second bracket and a positive electrode of a second light-emitting chip, and a second output terminal of the IC chip is electrically connected to a negative electrode of the second light-emitting chip;

the two brackets, the IC chip and the two light-emitting chips are packaged with a transparent epoxy resin into a package body, and the two brackets are provided with respective pins which extend out of the package body.

Preferably, the model of the IC chip is DC2013, and the IC chip has two built-in LED drive ports, one for forward conduction and one for reverse conduction.

Preferably, the IC chip integrates an H-bridge rectifier circuit, a resistance-capacitance (RC) oscillator, a pulse-width modulation (PWM) generator, an output mode selection module, a resistor anti-dead zone current supply module, a switch resistor ratio current module, an N-channel metal oxide semiconductor (NMOS) open-drain driver stage, and a driver module, wherein the H-bridge rectifier module has two power drive poles and is respectively interconnected with the RC oscillator and the resistor anti-dead zone current supply module, the RC oscillator is connected to the PWM generator, the PWM generator is connected to the output mode selection module, the output mode selection module is connected to the NMOS open-drain driver stage and the switch resistor ratio current module, and the NMOS open-drain driver stage provides two output terminals.

Preferably, a working mode of the IC chip can be any of single flashing mode, candle flashing mode, breathing-type flashing mode, gradual brightening mode and gradual dimming mode, etc.; the flashing frequency of the IC chip when working can be any value from 0.1 Hz to 6.0 Hz.

Compared with the background, this disclosure achieves the main technical effects in the following aspects.

Firstly, in use, both positive and negative voltages can be applied to achieve flashing with the same brightness, which facilitates the manufacturing of decorative lights, such as light strings;

Secondly, multiple working modes are provided to improve the decoration effect during holidays;

Lastly, production efficiency is improved, the structure is simplified by using a single IC chip to integrate the control circuit for packaging, and the service life is increased.

DETAILED DESCRIPTION OF THE EMBODIMENTS

In order to make the technical solutions of the present invention easier to understand and implement, the specific implementation modes of this disclosure are further described below in conjunction with the accompanying drawings.

Embodiment 1

Figure 1:
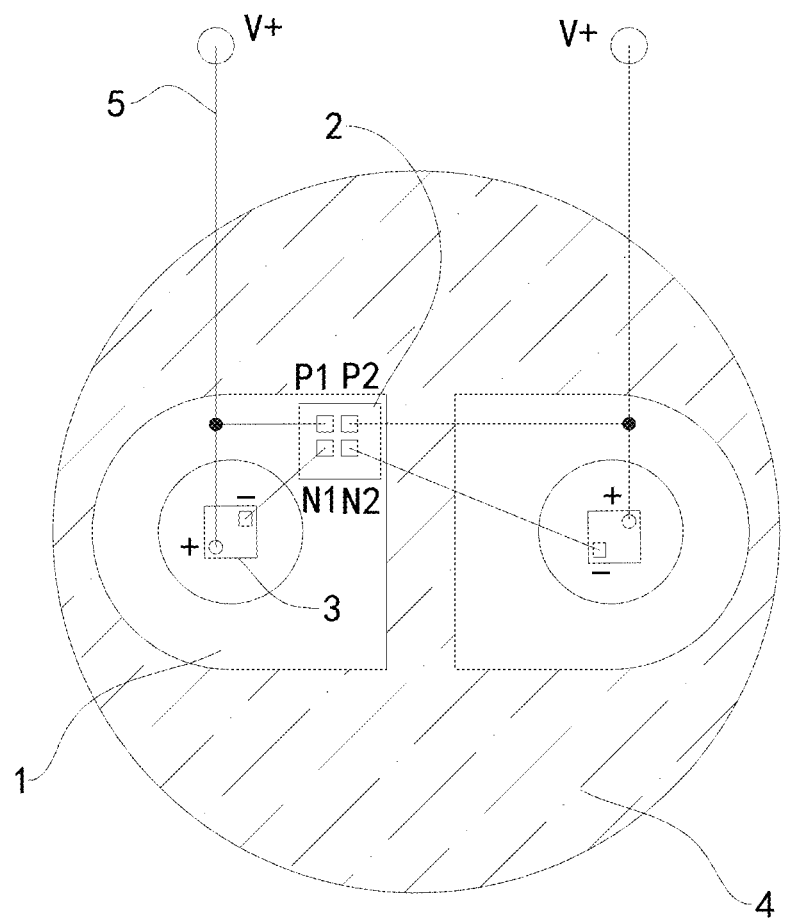
FIG. 1 is a schematic diagram of a structural principle in an embodiment.

A plug-in LED lamp bead with a built-in single IC chip having a bidirectional flashing function, as shown in FIG. 1, as an example, includes two brackets 1, wherein an IC chip 2 having a bidirectional flashing function is bonded to any one of the brackets 1 by using an electrically conductive and thermally conductive adhesive, and two light-emitting chips 3 are bonded to the two brackets 1 respectively by using an electrically conductive and thermally conductive adhesive; In terms of structure and shape, as shown in FIG. 1, the two brackets 1 have semicircular edges and are separated from each other. The two brackets 1 may be printed circuit boards (PCBs). The electrical connection is welding connection and fixation via a wire and can be powered. The wire may be a copper wire, a copper cable or a conductive metal wire.

A first power driving electrode of the IC chip 2 is electrically connected to a first bracket 1 and a positive electrode of a first light-emitting chip 3, and a first output terminal of the IC chip 2 is electrically connected to a negative electrode of the first light-emitting chip 3; a second power driving electrode of the IC chip 2 is electrically connected to a second bracket 2 and a positive electrode of a second light-emitting chip 3, and a second output terminal of the IC chip 2 is electrically connected to a negative electrode of the second light-emitting chip 3; the two brackets 1, the IC chip 2 and the two light-emitting chips 3 are packaged with a transparent epoxy resin into a package body 4, and the two brackets 1 are provided with respective pins 5 which extend out of the package body 4. The IC chip 2 that can transmit multiple signals does not no internal modification. This embodiment can be implemented using a single existing IC chip 2, thereby facilitating production and improving production efficiency.

Embodiment 2

Figure 2:
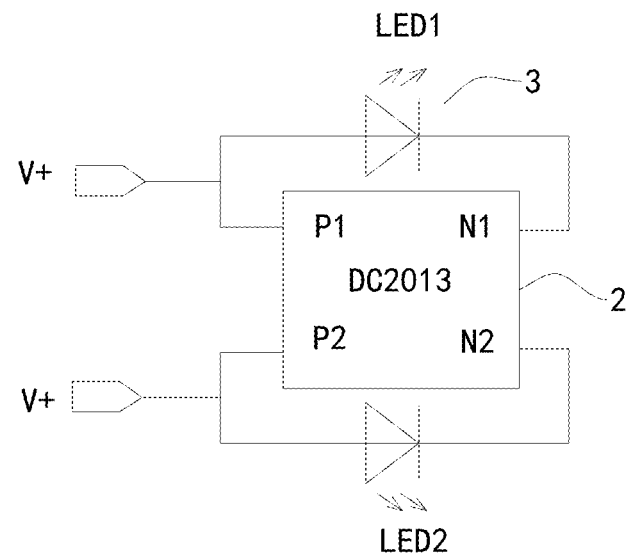
FIG. 2 is a schematic connection diagram of a circuit principle in an embodiment.
Figure 3:
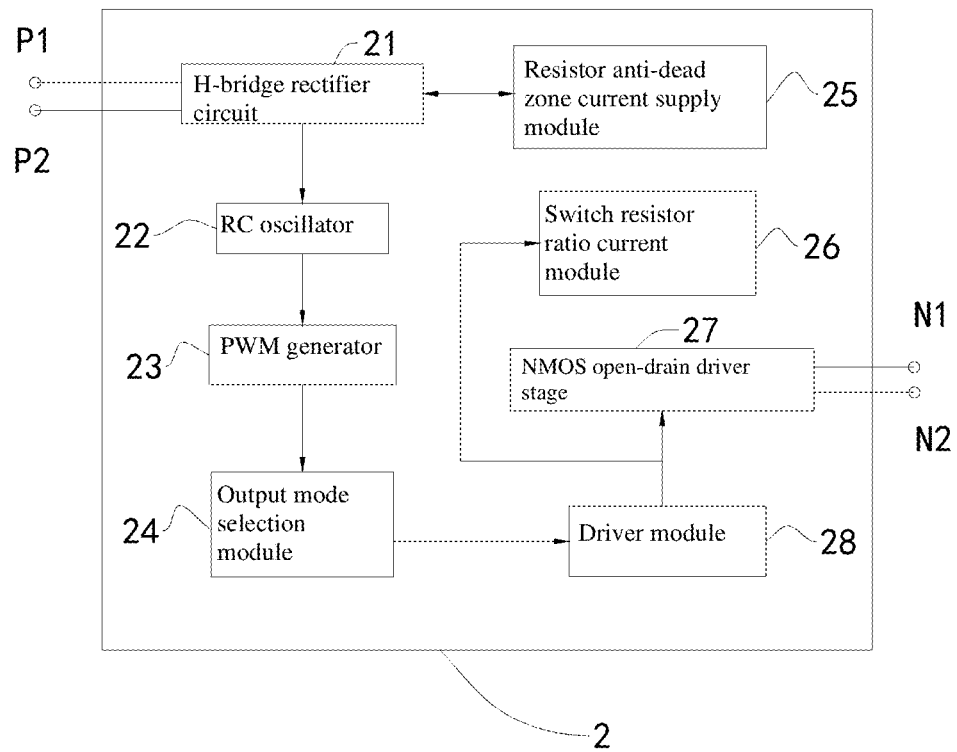
FIG. 3 is a schematic diagram of internal integrated modules of an IC chip in an embodiment.

Based on Embodiment 1 described above, the model of the IC chip 2 may be DC2013, and the IC chip 2 has two built-in LED drive ports, one for forward conduction and one for reverse conduction. Referring to FIGS. 2 and 3.

In particular, the IC chip 2 integrates an H-bridge rectifier circuit 21, an RC oscillator 22, a PWM generator 23, an output mode selection module 24, a resistor anti-dead zone current supply module 25, a switch resistor ratio current module 26, an NMOS open-drain driver stage 27, and a driver module 28, wherein the H-bridge rectifier module has two power drive poles and is respectively interconnected with the RC oscillator 22 and the resistor anti-dead zone current supply module 25, the RC oscillator 22 is connected to the PWM generator, the PWM generator is connected to the output mode selection module 24, the output mode selection module 24 is connected to the NMOS open-drain driver stage 27 and the switch resistor ratio current module 26, and the NMOS open-drain driver stage 27 provides two output terminals. A working mode of the IC chip 2 can be any of single flashing mode, candle flashing mode, breathing-type flashing mode, gradual brightening mode, gradual dimming mode, etc.; the flashing frequency of the IC chip 2 when working can be any value from 0.1 Hz to 6.0 Hz.

The IC chip 2 has two built-in LED drive ports, one for forward conduction and one for reverse conduction, thereby realizing non-polarity wiring to a power supply. Due to its convenient wiring and flexible connection, this disclosure can be widely used in Christmas decoration lights, background lighting, stage atmosphere lighting and building lighting.

The above are only typical examples of this disclosure. In addition, this disclosure may have many other specific implementations. Any technical solutions formed by equivalent replacement or equivalent transformation fall within the scope claimed by this disclosure.

What is claimed is:

1. A plug-in light-emitting diode (LED) lamp bead with a built-in single integrated circuit (IC) chip having a bidirectional flashing function, comprising two brackets, wherein an IC chip having a bidirectional flashing function is bonded to any one of the brackets by using an electrically conductive and thermally conductive adhesive, and two light-emitting chips are bonded to the two brackets respectively by using an electrically conductive and thermally conductive adhesive;

a first power driving electrode of the IC chip is electrically connected to a first bracket and a positive electrode of a first light-emitting chip, and a first output terminal of the IC chip is electrically connected to a negative electrode of the first light-emitting chip;

a second power driving electrode of the IC chip is electrically connected to a second bracket and a positive electrode of a second light-emitting chip, and a second output terminal of the IC chip is electrically connected to a negative electrode of the second light-emitting chip;

the two brackets, the IC chip and the two light-emitting chips are packaged with a transparent epoxy resin into a package body, and the two brackets are provided with respective pins which extend out of the package body.

2. The plug-in LED lamp bead according to claim 1, wherein the IC chip has two built-in LED drive ports, one for forward conduction and one for reverse conduction.

3. The plug-in LED lamp bead according to claim 2, wherein the IC chip integrates an H-bridge rectifier circuit, a resistance-capacitance (RC) oscillator, a pulse-width modulation (PWM) generator, an output mode selection module, a resistor anti-dead zone current supply module, a switch resistor ratio current module, an N-channel metal oxide semiconductor (NMOS) open-drain driver stage, and a driver module, wherein the H-bridge rectifier module has two power drive poles and is respectively interconnected with the RC oscillator and the resistor anti-dead zone current supply module, the RC oscillator is connected to the PWM generator, the PWM generator is connected to the output mode selection module, the output mode selection module is connected to the NMOS open-drain driver stage and the switch resistor ratio current module, and the NMOS open-drain driver stage provides two output terminals.

4. The plug-in LED lamp bead according to claim 1, wherein a working mode of the IC chip comprises any of single flashing mode, candle flashing mode, breathing-type flashing mode, gradual brightening mode and gradual dimming mode; the flashing frequency of the IC chip when working comprises any value from 0.1 Hz to 6.0 Hz.

\* \* \* \* \*